(12) United States Patent
Manolios et al.

(10) Patent No.: US 10,025,696 B2
(45) Date of Patent: Jul. 17, 2018

(54) SYSTEM AND METHOD FOR EQUIVALENCE CLASS ANALYSIS-BASED AUTOMATED REQUIREMENTS-BASED TEST CASE GENERATION

(71) Applicant: General Electric Company, Schenectady, NY (US)

(72) Inventors: Panagiotis Manolios, Sharon, MA (US); Meng Li, Niskayuna, NY (US); Italo Oliveira, Rio de Janeiro (BR); Augusto Marasca De Conto, Rio de Janeiro (BR)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 155 days.

(21) Appl. No.: 15/019,725

(22) Filed: Feb. 9, 2016

(65) Prior Publication Data
US 2017/0228309 A1     Aug. 10, 2017

(51) Int. Cl.
G06F 11/36     (2006.01)
G06F 17/50     (2006.01)
(Continued)

(52) U.S. Cl.
CPC ........ *G06F 11/3684* (2013.01); *G06F 11/368* (2013.01); *G06F 11/2273* (2013.01); *G06F 17/11* (2013.01); *G06F 17/5009* (2013.01)

(58) Field of Classification Search
CPC .............. G06F 11/3684; G06F 11/368; G06F 11/2273; G06F 17/5009; G06F 17/11
(Continued)

(56) References Cited

U.S. PATENT DOCUMENTS 5,652,835 A     7/1997 Miller
7,272,752 B2    9/2007 Farchi et al.
(Continued)

FOREIGN PATENT DOCUMENTS

CN     102063376 A     5/2011

OTHER PUBLICATIONS

"Simulink," Retrieved from Internet URL: https://web.archive.org/web/20170829190045/https://in.mathworks.com/products/simulink.html, pp. 1-3 (Dec. 26, 2017).
(Continued)

*Primary Examiner* — Wei Zhen
*Assistant Examiner* — Mohammed Huda
(74) *Attorney, Agent, or Firm* — GE Global Patent Operation; Nitin Joshi

(57) ABSTRACT

A system for equivalence class analysis-based automated requirements-based test case generation includes a control processor, a data store containing textual design requirements, a textual converter unit structured to convert the textual design requirements to a machine-readable version of design requirements, a requirement partition unit configured to partition the machine-readable design requirements into one or more sets of related design requirements, an equivalence class partition unit configured to process the machine-readable design requirements and input/output variables into a set of equivalence classes, an equivalence class analyzer unit structured to analyze the set of equivalence classes to generate equivalence class tests and identify uncovered input space, and a boundary class analyzer unit structured to identify boundaries of the equivalence classes and generate boundary value tests and robustness tests. A method for equivalence class analysis-based automated requirements-based test case generation implementable on
(Continued)

the system, and a non-transitory computer readable medium are also disclosed.

11 Claims, 4 Drawing Sheets

(51) Int. Cl.
*G06F 11/22* (2006.01)
*G06F 17/11* (2006.01)

(58) Field of Classification Search
USPC .......................................................... 717/124
See application file for complete search history.

(56) References Cited

U.S. PATENT DOCUMENTS

| | | | |
|---|---|---|---|
| 7,296,188 | B2 | 11/2007 | Paternostro et al. |
| 7,392,509 | B2 | 6/2008 | Sinha et al. |
| 7,478,365 | B2 | 1/2009 | West et al. |
| 7,584,451 | B2 | 9/2009 | Iborra et al. |
| 7,644,334 | B2 | 1/2010 | Hickman et al. |
| 7,979,849 | B2 | 7/2011 | Feldstein et al. |
| 8,307,342 | B2 | 11/2012 | Oglesby et al. |
| 8,407,800 | B2 | 3/2013 | Schloegel et al. |
| 8,612,171 | B2 | 12/2013 | Awedikian et al. |
| 2006/0010426 | A1* | 1/2006 | Lewis ................. G06F 11/3684 717/124 |
| 2006/0010429 | A1 | 1/2006 | Ihara |
| 2007/0250799 | A1 | 10/2007 | Bunin et al. |
| 2009/0319830 | A1 | 12/2009 | Zander-Nowicka et al. |
| 2010/0192128 | A1 | 7/2010 | Schloegel et al. |
| 2010/0235814 | A1 | 9/2010 | Ohta et al. |
| 2011/0083121 | A1 | 4/2011 | Dixit et al. |
| 2013/0042222 | A1 | 2/2013 | Maddela |
| 2013/0185033 | A1* | 7/2013 | Tompkins .............. G01V 11/00 703/2 |
| 2014/0026125 | A1 | 1/2014 | Pasala et al. |
| 2015/0089296 | A1* | 3/2015 | Dermler .............. G06F 11/3684 714/38.1 |

OTHER PUBLICATIONS

Gabel, M., "Requirements-based Test Generation," Retreived from Internet URL: https://web.archive.org/web/20151128182328/http://www.utdallas.edu/~mgg110030/teaching/se6367f12/02a-Test-Gen-Requirements.pdf, pp. 1-27 (Dec. 26, 2017).

Jokhio, M. S., et al., "Towards Specification Based Testing for Semantic Web Services," Australian Software Engineering Conference, pp. 54-63 (Apr. 14-17, 2009).

Lee, C., and Friedman, J., "Requirements Modeling and Automated Requirements-Based Test Generation," SAE International Journal of Aerospace, vol. 6, Issue 2, pp. 607-615 (2013).

Extended European Search Report and Opinion issued in connection with corresponding EP Application No. 17154748.2 dated Jun. 22, 2017.

* cited by examiner

SYSTEM AND METHOD FOR EQUIVALENCE CLASS ANALYSIS-BASED AUTOMATED REQUIREMENTS-BASED TEST CASE GENERATION

BACKGROUND

Safety-critical software needs to be strictly tested according their software certification standards (e.g. DO-178C for aviation software). Representative values (e.g. values in equivalence classes) and error-prone values (boundaries values and abnormal ranges) are required to be tested at the requirements-level. Conventionally, these test cases are manually generated and are time-consuming.

Conventional approaches to automated test generation can capture (i.e., model) the software design requirements as a statechart. Then a state machine can implement a forward/backward propagation process to determine test vectors from the state chart. A test generator determines if a transition is reached by walking through the statechart model of the software design.

The Unified Modeling Language (UML) specification includes a standard for specifying statecharts. Other methods and descriptions of statecharts and similar finite automata have been used to describe software design and/or requirements as well, including Harel statecharts, state diagrams, and finite state machines, among others. Available off the shelf tools and techniques for generating tests using these statecharts achieve structural code coverage only. Further, the off the shelf tools may take an excessive amount of time to generate tests from a statechart.

DESCRIPTION

In accordance with embodiments, systems and methods automatically generate requirements-based test cases using equivalence class analysis so that representative values (e.g., values in equivalence classes) and error-prone values (e.g., boundaries values, abnormal ranges, etc.) can be tested at the requirements-level using the generated test cases.

Valid and invalid equivalence classes are differentiated according to whether they are within normal range or abnormal range. Equivalence class tests are selected from the valid equivalence classes. Boundary values are identified at the boundaries of adjacent equivalence classes, so that the behavior transition of the software can be tested. Boundary value tests are selected from the boundaries of the valid equivalence classes, and robustness tests are selected from the boundaries of the invalid equivalence classes and/or the extreme values of the input physical range.

Equivalence classes induced by the requirements are defined to be sets of input vectors that activate the same subset of requirements. By testing one value in the equivalence class, it is equivalent to test all other values that activate this subset of requirements, which represent a specified behavior of the software.

Embodying systems and methods can automatically generate equivalence class tests, boundary value tests, and robustness tests from a set of requirements based on equivalence class analysis technology. Embodying methods can include two approaches (i.e., set-based approach, and formal methods based approach) to automatically perform equivalence class analysis.

Figure 1:
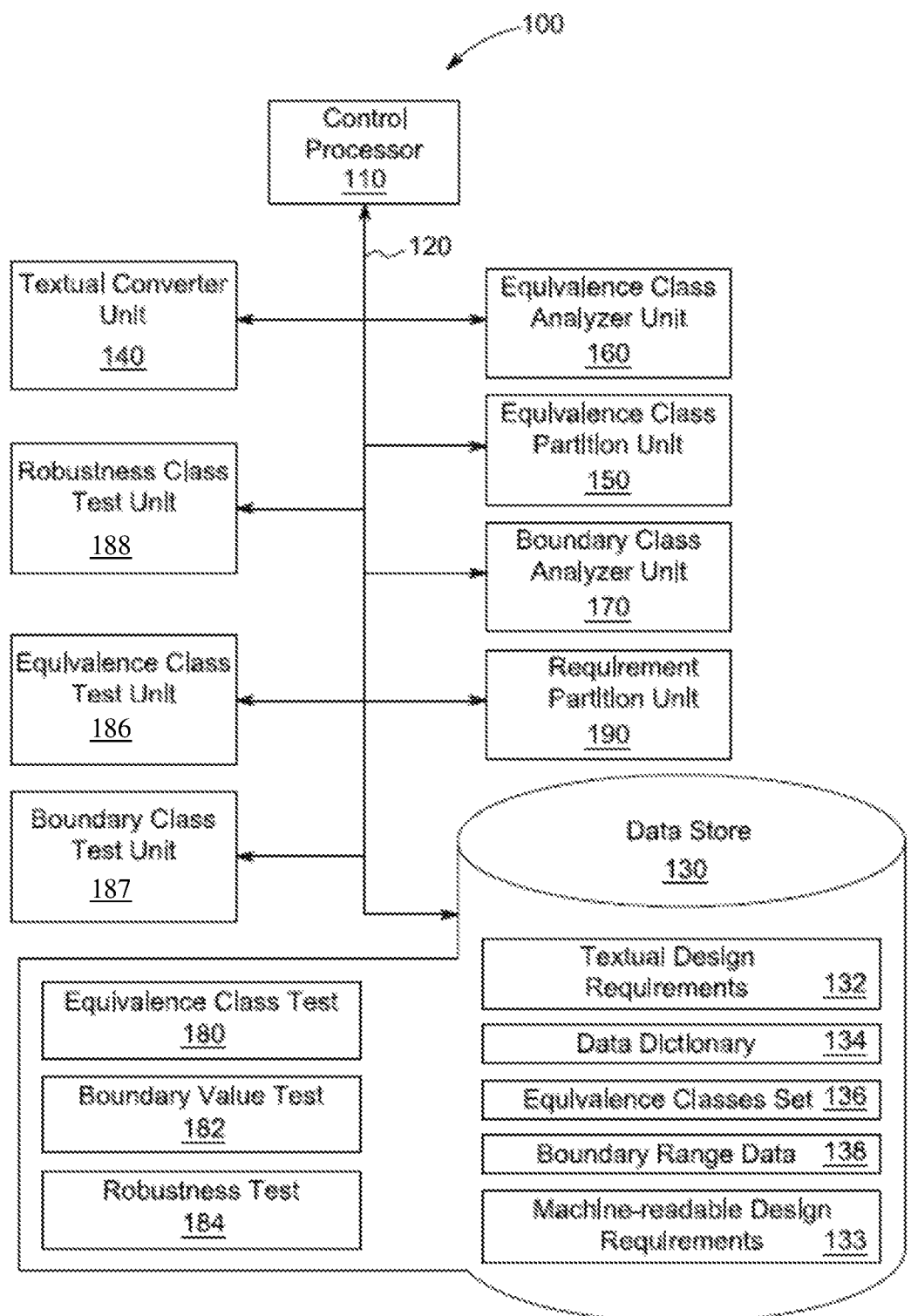
FIG. 1 depicts a system for equivalence class analysis based test case generation in accordance with embodiments.

FIG. 1 depicts equivalence class analysis based test case generation system 100 in accordance with embodiments. System 100 can be an automated test case generation (ATCG) system that can automatically generate test cases from a set of requirements based on equivalence class analysis. System 100 includes control processor 110 which executes computer instructions to control the operation of the system and its components. Control processor 110 can be located in a computer, or a server, and interconnected to the various components via communication link 120. The communication link can be an internal bus, an electronic communication network, or the like.

System 100 includes data store 130 that can contain textual design requirements 132 (e.g., system level and/or high level requirements) of the safety-critical software. These textual system design requirements can be converted into a machine-readable language by textual converter unit 140. The machine-readable language of the requirements is accessible by system 100 for automated analysis as disclosed herein. Data dictionary 134 contains input and output variable information regarding input and output variables. The machine-readable requirements and the contents of the data dictionary can be processed by equivalence class partition unit 150. A set of equivalence classes 136 induced by the requirements, when analyzed in view of the input and output variables, is produced by the equivalence class partition unit. Equivalence class test(s) 180, boundary value test(s) 182, and robustness test(s) 184, as disclosed below, can also be stored in data store 130.

Equivalence class analyzer unit 160 is structured to analyze equivalence classes set 136 to identify which classes are, and are not, covered by any requirements. Those classes not covered can be identified as uncovered input ranges, which need to be reported for requirements completeness check. For each of the covered equivalence classes, if it is within the normal range, a value is selected from the equivalence class as the equivalence class test 180; if it is in the abnormal range, no test is selected.

Each input/output variable has a normal range and a physical range. Its normal range is the set of values that the variable can choose when the design is running normally. Its physical range is the set of values that the variable can choose from both its normal range and abnormal range. Boundary class analyzer unit 170 is structured to analyze the set of equivalence classes to identify the boundaries of the equivalence classes. Boundary range data 138 can be stored in data store 130. For each of the identified boundaries, values are selected on the boundary and on either side of the boundary. If the selected value is within a normal range it is identified as boundary value test 182; if the selected value is within an abnormal range, it is identified as robustness test 184.

Embodying systems and methods can perform equivalence class analysis (including equivalence class partition and boundary value analysis). Machine-readable design requirements 133 are first partitioned by requirement partition unit 190. This partition unit is configured to find one or more minimum sets of related design requirements (e.g., those requirements impacting the same set of outputs) to reduce testing complexity.

An equivalence class analysis process can be performed on the minimum sets. A set-based approach uses polytopes to represent the requirement conditions (i.e., a condition to activate the requirement). A set-based approach analyzes the requirements to identify set intersection and/or union to find the equivalence classes, which activate subsets of the requirements. The set-based approach enables the user to select value at different places in the equivalence classes or boundaries. A formal methods based approach uses predicates to represent the requirement conditions and apply formal methods to find the test cases. The formal methods based approach is better at dealing with input variables that interact with each other in the requirement conditions. A user can choose from among these approaches (set- or formal-based) depending on the type of the requirements or the standard of the test cases. The expected output is automatically obtained by attaching the test input value as test objective in a requirement model and applying model checking technology to find an output value so that the requirements are satisfied.

The formal definition of the equivalence classes can be described as follows:

Definition 1: Given a set of requirements R and input operating space (normal range) $G_{op}(u_1, u_2, \ldots, u_n)$, the valid equivalence class partition $P^R$ induced by R is represented by Equation 1; and invalid equivalence class $P^{inv}$ is represented by Equation 2:

$$P^R := U_{R' \subseteq R}\{G_{op} \wedge \bigwedge_{r \in R'} G_r \wedge \bigwedge_{r \in R-R'} \neg G_r\} \quad \text{EQ. 1}$$

$$P^{inv} := U_{R' \subseteq R}\{\neg G_{op} \wedge G_{phy} \wedge \bigwedge_{r \in R'} G_r \wedge \bigwedge_{r \in R-R'} \neg G_r\} \quad \text{EQ. 2}$$

where $G_r(u_1, u_2, \ldots, u_n)$ is requirement condition for requirement r∈R; and $G_{phy}$ is input space (physical range).

As described by Definition 1, valid and invalid equivalence classes are differentiated according to whether they are within the normal range or the abnormal range. Equivalence class tests are selected from the valid equivalence classes. Boundaries values are identified from the boundaries of adjacent equivalence classes, so that the behavior transition of the software can be tested. Boundary value tests are selected from the boundaries of the valid equivalence classes, and robustness tests are selected from the boundaries of the invalid equivalence classes and the extreme values of the input physical range.

Figure 2:
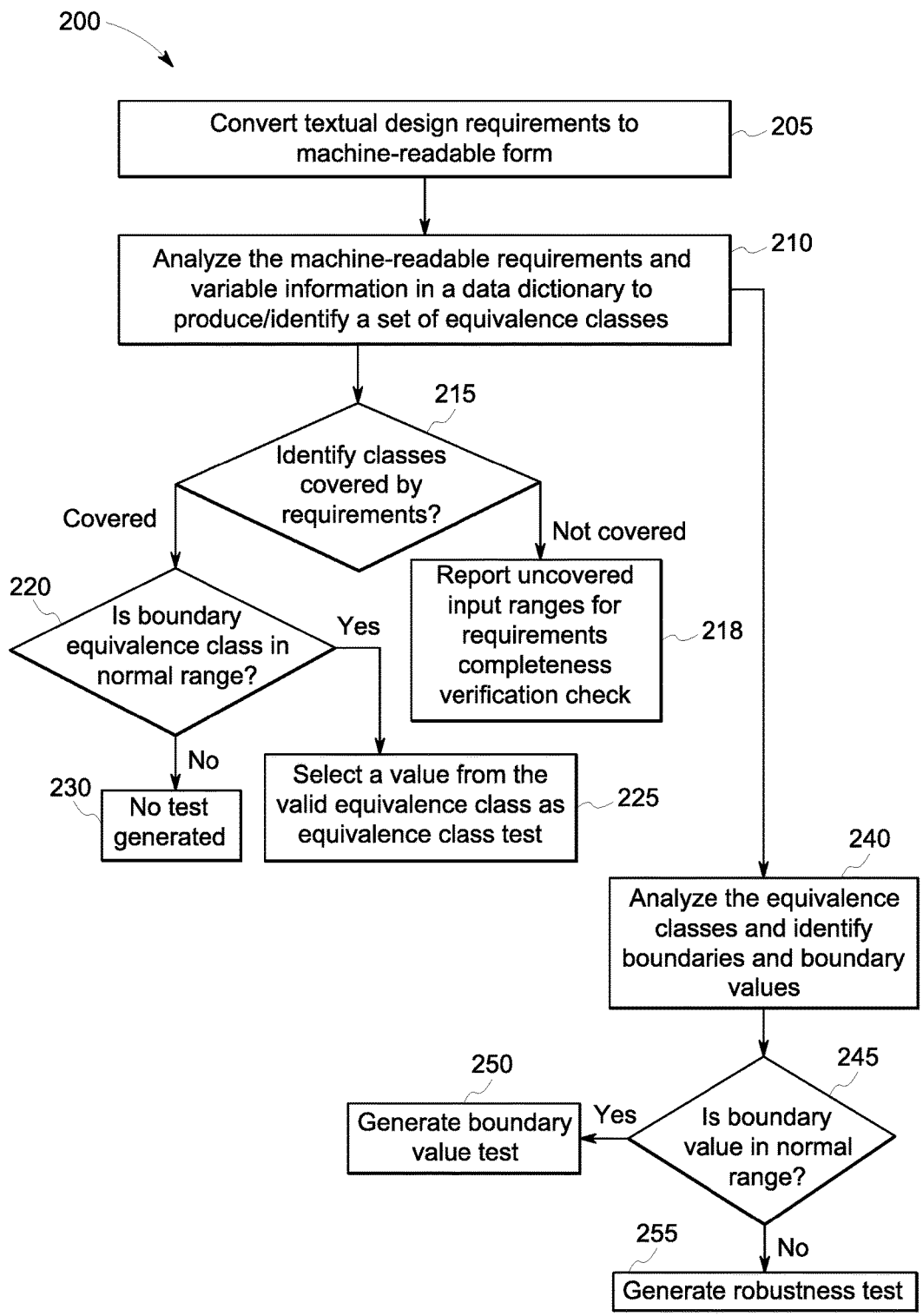
FIG. 2 depicts a process for equivalence class analysis based test case generation in accordance with embodiments.

FIG. 2 depicts equivalence class analysis based test case generation process 200 in accordance with embodiments. Textual design requirements 132 are converted, step 205, to a machine-readable language by textual converter unit 140. Variable information in data dictionary 134 and the machine-readable requirements are analyzed, step 210, by equivalence class partition unit 150. This analysis produces, and/or identifies, a set of equivalence classes 132 induced by the requirements. Equivalence classes covered by any requirements are identified, step 215. Input ranges not covered by any of the requirements are reported, step 218, for a requirements completeness verification check.

An evaluation is performed, step 220, to determine whether the covered equivalence class is within the normal range or within the abnormal range. For each of the covered equivalence classes within the normal range a value is selected, step 225, from the equivalence class as equivalence class test 180. If a covered equivalence class is in the abnormal range, process 200 flows from step 220 to step 230, where no test is generated.

The equivalence classes identified in step 210 are analyzed, step 240, by boundary class analyzer unit 170, where the boundaries between equivalence classes are identified and values are selected from the boundaries based on the test criteria. Whether the boundary value is in the normal range is determined, step 245, for each identified boundary value. If the boundary value is within the normal range, boundary value test 182 is generated, step 250. If the boundary value is within the abnormal range, robustness test 184 is generated, step 255.

Embodying systems and methods can implement at least two approaches to perform the equivalence class analysis (including equivalence class partition and boundary value analysis). The set of requirements can first be partitioned by identifying sets of requirements that are connected in a chain of dependencies determined by shared output variables (e.g., if requirement R1 has outputs A and B, requirement R2 has outputs B and C, and requirement R3 has outputs C and D, R1, R2, and R3 are connected). If so, they can all be part of the same connected component. This approach can reduce complexity.

Figure 3:
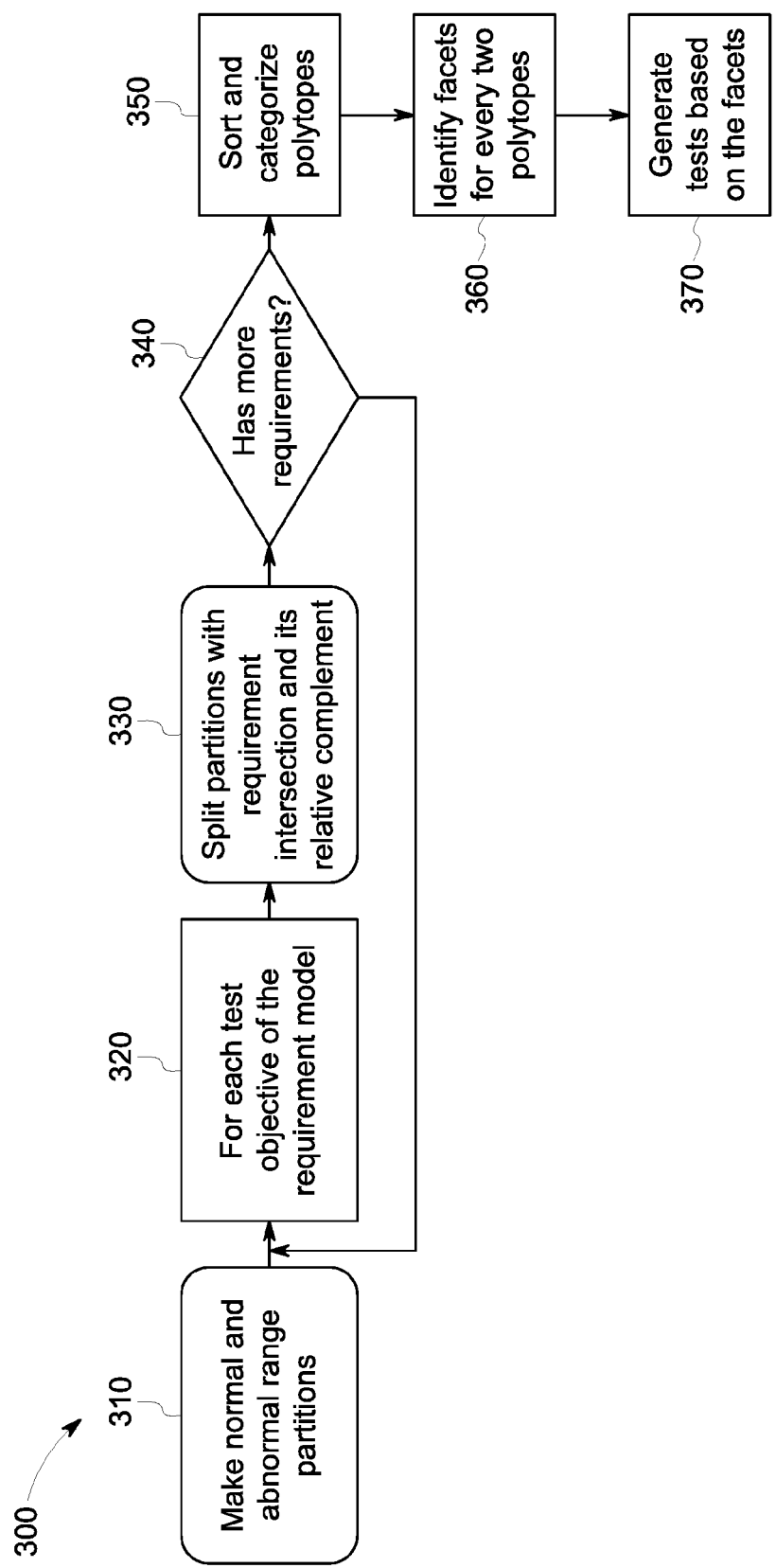
FIG. 3 depicts a set-based approach to implement the equivalence class analysis of FIG. 2 in accordance with embodiments.

FIG. 3 depicts process 300 for a set-based approach to implement the equivalent class analysis depicted in FIG. 2 in accordance with embodiments. In the set-based approach each requirement condition is represented as a union of convex polytopes (to represent non-convex polytopes) that covers all input variables, where each input variable is one dimension of the polytopes. The same representation is used for normal and abnormal input ranges. A partition process is used over input space to obtain the polytopes. Initially, the input space is partitioned into normal range polytopes and abnormal range polytopes, step 310. A loop, steps 320-340, is performed for each requirement. Each requirement along with its requirement condition splits, step 330, the current polytopes into sub-polytopes: the sub-polytope covered by that requirement condition (i.e., the intersection of current polytope and the requirement condition polytope); and the sub-polytope not covered by the requirement condition (i.e., the relative complement of requirement in current polytope). If there are more requirements, step 340, the loop repeats (steps 320-340). After the partition process, each polytope is sorted into a corresponding equivalence class, step 350.

If the polytope comes from a normal range, it is a valid equivalence class, and an equivalence class test is selected by picking one value from the polytope according to the criteria (e.g., the center value of the polytope). If the polytope comes from the abnormal range, it is an invalid equivalence class and no test is generated at this point. If the polytope is not covered by any requirement condition polytope, it is reported for requirements completeness verification.

After the polytopes (i.e., equivalence classes) are generated, shared facets are identified for every two polytopes, step 360. These facets are the boundaries between equivalence classes. Tests are generated, step 370, by selecting values from the facets based on the test criteria. If the test belongs to a normal range polytope, it is a boundary value test; if the test belongs to an abnormal range polytope, it is a robustness test. If the test belongs to a polytope not covered by any requirement conditions, it is not a valid test and will not be stored. The test selection criteria vary according to the test standards and variable data type (e.g., precision, tolerance, etc.).

Figure 4:
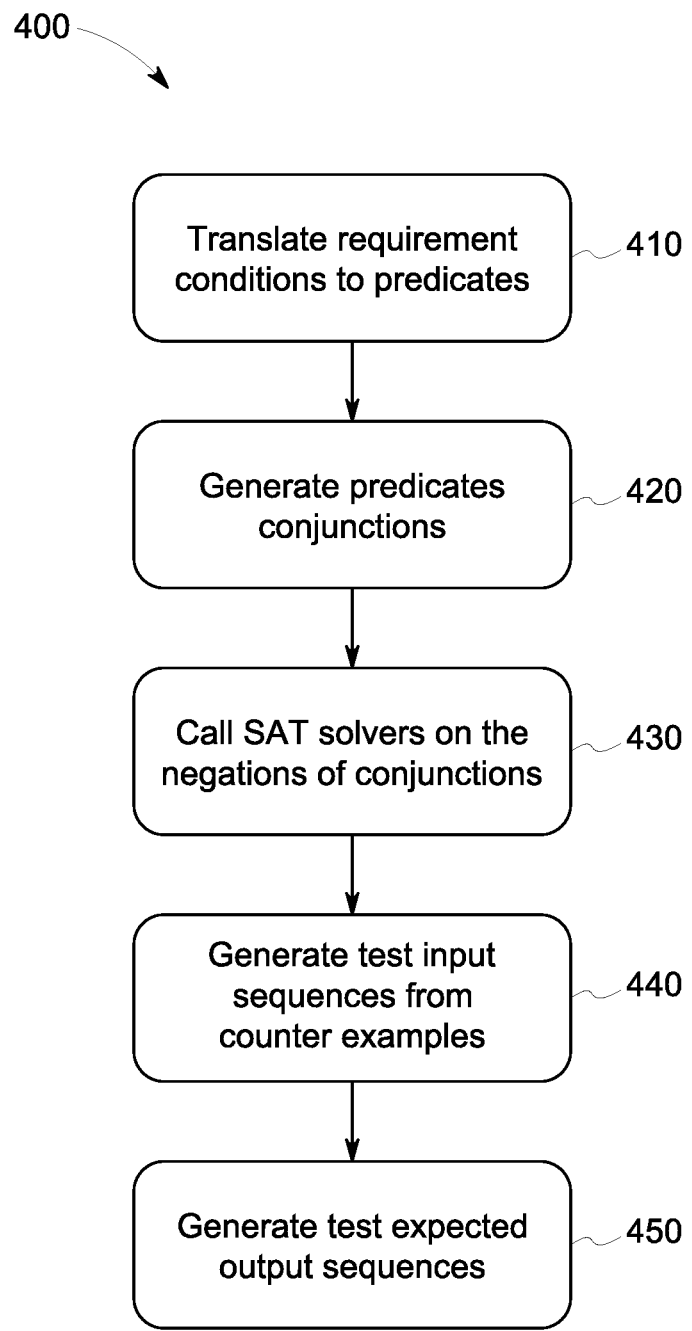
FIG. 4 depicts a process for formal-methods based equivalence class analysis in accordance with embodiments.

FIG. 4 depicts process 400 for a formal-methods based approach to implement the equivalence class analysis depicted in FIG. 2 in accordance with embodiments. Beginning with identified requirement connected components (which are identified by requirements partition unit 190), process 400 translates, step 410, the requirement conditions to predicates that can be read by a formal method tool (e.g., a satisfiability (SAT) solver). For each subset of requirements, the conjunction of predicates is generated, step 420, to represent the activation condition of the subset of requirements. The predicates conjunction is the equivalence class that activates the subset of requirements. To generate shared boundary between every two equivalence classes, the two equivalence classes are first augmented to include their boundaries (e.g., ">" is changed to ">=", and "<" is changed to "<=") and the conjunction of predicates of the augmented equivalence classes are generated to be the shared boundary, step 420. To detect uncovered input space, the conjunction of the negations of all requirements predicates is generated, step 420.

Then, process 400 calls the formal methods tool (e.g., SAT solver), step 430, on the negations of the generated predicates conjunctions (equivalence classes, shared boundaries, and uncovered input space). If the negation is not always satisfied for all possible inputs in the input space, the SAT solver can produce a counterexample to the negation which is a value that satisfies the predicates conjunction. The counterexample is a test case (equivalence class test, boundary value test, or robustness test) if the predicates conjunction is equivalence class or shared boundary. The counterexample indicates the existence of the uncovered input space if the predicates conjunction is uncovered input space. At step 440, the equivalence class test, boundary value test, or robustness test input sequence can be generated and/or extracted from the counterexample. This generation and/or extraction can be respectively performed by equivalence class test unit 186, boundary class test unit 187, and robustness class test unit 188.

If the SAT solver determines the negations are always satisfied at step 430, the predicate conjunction is not satisfiable (i.e., the equivalence class or shared boundary does not exist) and no test case is needed. If the SAT solver returns "unknown" result, the satisfiability problem cannot be solved by the SAT solver and manual analysis can be performed. After generating the test input sequence(s), the test expected output sequences for the test cases can be generated by setting the requirement input as the input sequences identified at step 440 and call the SAT solver on the requirement to generate, step 450, an output sequence that satisfies the requirement.

Embodying system and methods automate the equivalence class test, boundary value test, and robustness test generation process. Also uncovered input space can be automatically detected. These uncovered input spaces can indicate potential gaps and other errors in the requirements. The automation of equivalence class analysis and test case generation process can reduce test time and improve the overall test quality.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods discussed herein such as automatic generation of requirements-based test cases using set-based and/or formal methods-based equivalence class analysis, as described above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A system for equivalence class analysis-based automated requirements-based test case generation, the system comprising:
   a control processor configured to execute computer instructions to control components of the system;
   a data store containing textual design requirements;
   a textual converter unit structured to convert the textual design requirements to a machine-readable version of design requirements;
   a requirement partition unit configured to partition the machine-readable design requirements into one or more sets of related design requirements, an equivalence class partition unit configured to process the machine-readable design requirements and input/output variables into a set of equivalence classes;
   an equivalence class analyzer unit structured to analyze the set of equivalence classes, wherein analyzing the set of equivalence classes includes partitioning the machine-readable design requirements by identifying sets of design requirements connected in a chain of dependencies; and
   a boundary class analyzer unit structured to identify boundaries of the equivalence classes;
   wherein the control processor is further configured to execute computer instructions to:
      partition over all input space to obtain the convex polytopes including, where the input space is partitioned into normal range and abnormal range polytopes;
      split the polytopes using each design requirement and an associated requirement condition into a sub-polytope not covered by the associated requirement condition, and a sub-polytope covered by the associated requirement condition;
      sort each polytope into a corresponding equivalence class;
      for polytopes in the normal range select an equivalence class test by picking a value from the polytope according to a test criteria, else not generate an equivalence class test;
      identify shared facets between every two polytopes, where the shared facet represents a boundary between equivalence classes;
      generate tests by selecting values from the shared facets based on the test criteria;

where the generated test is a boundary value test if a normal range polytope; and where the generated test is a robustness test if an abnormal range polytope.

2. The system of claim 1, including the equivalence class analyzer unit configured to identify equivalence classes that are covered, or are not-covered, by the machine-readable design requirements.

3. The system of claim 2, including the equivalence class analyzer unit configured to:
report to a user the not-covered equivalence classes for a requirements completeness check;
if a covered equivalence class is within a normal range, select a value from that covered equivalence class, and store the selected value as an equivalence class test in the data store; and
if a covered equivalence class is within an abnormal range, not select a value.

4. The system of claim 1, including the boundary class analyzer unit configured to:
select at each of the identified boundaries a set of boundary values according to the test criteria;
if a boundary value of the set of boundary values is within a normal range, identify the boundary value as a boundary value test; and
if a boundary value of the set of boundary values is within an abnormal range, identify the boundary value as a robustness test.

5. The system of claim 1, including the equivalence class partition unit, equivalence class analyzer unit, and boundary class analyzer unit configured to perform a set-based analysis approach or a formal-based analysis approach on the one or more sets of related design requirements.

6. A non-transitory computer-readable medium having stored thereon instructions which when executed by a control processor cause the control processor to:
convert textual design requirements to a machine-readable version of design requirements;
partition the machine-readable design requirements into one or more sets of related design requirements;
process the sets of machine-readable design requirements and associated input/output variables into a set of equivalence classes;
analyze the set of equivalence classes, wherein the analyzing includes:
identifying equivalence classes that are covered, or are not-covered, by the machine-readable design requirements;
reporting to a user the not-covered equivalence classes for a requirements completeness check;
if a covered equivalence class is within a normal range, selecting a value from that covered equivalence class, else not selecting a value; and
storing the selected value as an equivalence class test;
perform the analyzing the set of equivalence classes by:
applying a formal methods-based approach including representing each requirement as predicates;
translating machine-readable requirements to predicates;
generating predicates conjunctions for equivalence classes, shared boundaries and uncovered input space;
calling a formal methods tools on the negations of the predicates conjunctions and obtain counterexamples;
generating test input sequences from counterexamples; and
generating expected outputs by attaching generated test inputs sequences as test objectives to requirements models.

7. The non-transitory computer-readable medium of claim 6, including instructions to cause the control processor to:
control a boundary class analyzer unit to analyze the set of equivalence classes to get boundary value tests and robustness tests by:
identifying a respective boundary for every two equivalence classes;
identifying respective boundary values for each respective boundary according to a test criteria;
if the respective boundary values are within a normal range, generating a boundary value test based on the respective boundary values; and
if the respective boundary values are within an abnormal range, generating a robustness test based on the respective boundary values.

8. The non-transitory computer-readable medium of claim 6, including instructions to cause the control processor to perform the analyzing the set of equivalence classes by partitioning the machine-readable design requirements by identifying sets of design requirements connected in a chain of dependencies.

9. The non-transitory computer-readable medium of claim 6, including instructions to cause the control processor to perform the analyzing the set of equivalence classes by applying a set-based approach including representing each requirement as a union of convex polytopes covering all input variables.

10. The non-transitory computer-readable medium of claim 7, including instructions to cause the control processor to:
partition over all input space to obtain the convex polytopes including, where the input space is partitioned into normal range and abnormal range polytopes;
split the polytopes using each design requirement and an associated requirement condition into a sub-polytope not covered by the associated requirement condition, and a sub-polytope covered by the associated requirement condition; and
sort each polytope into a corresponding equivalence class.

11. The non-transitory computer-readable medium of claim 8, including instructions to cause the control processor to:
for polytopes in the normal range select an equivalence class test by picking a value from the polytope according to a test criteria, else not generating an equivalence class test;
identify shared facets between every two polytopes, where the shared facet represents a boundary between equivalence classes;
generate tests by selecting values from the shared facets based on the test criteria;
where the generated test is a boundary value test if a normal range polytope; and
where the generated test is a robustness test if an abnormal range polytope.

* * * * *